Aug. 18, 1964 A. E. MARTENS 3,145,347
INTERRUPTER CIRCUIT
Filed Jan. 2, 1962
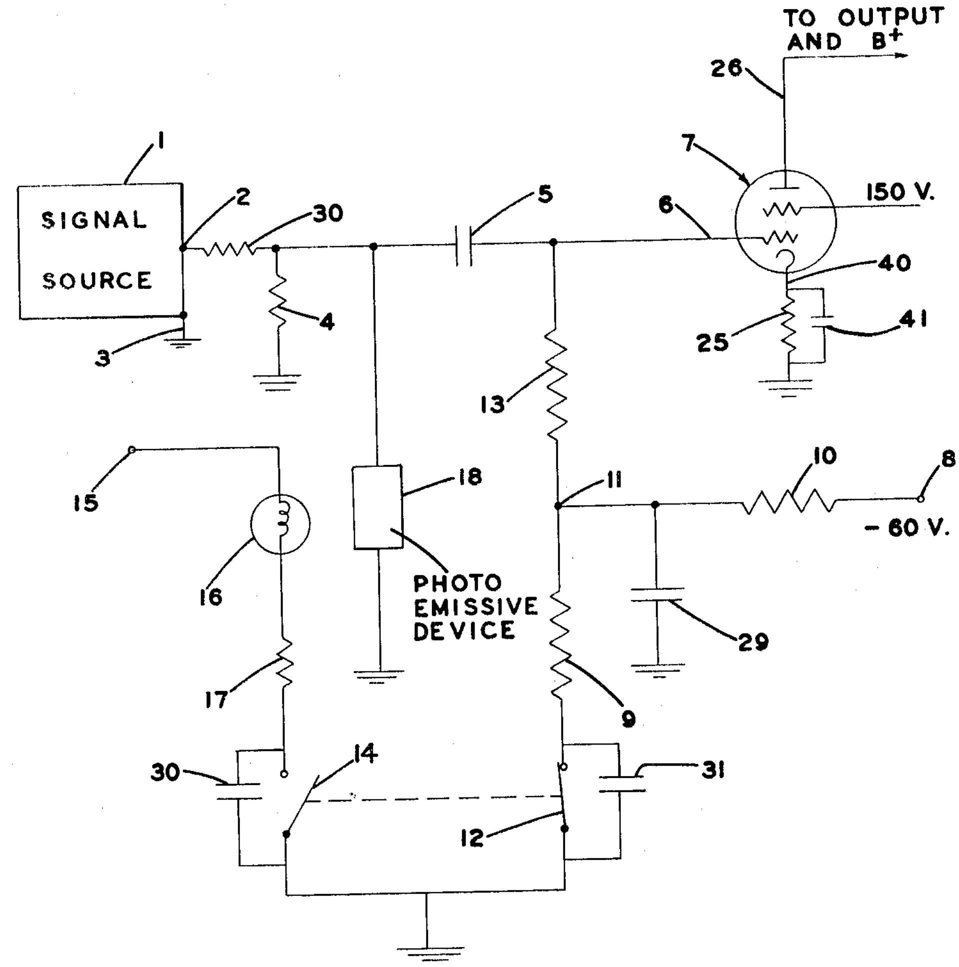
INVENTOR.
ALEXANDER E. MARTENS
BY Frank C. Parker
Arthur L. Nelson
ATTORNEYS United States Patent Office 3,145,347

Patented Aug. 18, 1964

3,145,347
INTERRUPTER CIRCUIT

Alexander E. Martens, Greece, N.Y., assignor to Bausch & Lomb Incorporated, Rochester, N.Y., a corporation of New York Filed Jan. 2, 1962, Ser. No. 163,456
3 Claims. (Cl. 330—51)

This invention relates to a signal control circuit for an amplifier stage and more particularly to a photo interrupter and bias circuit.

An ideal audio signal interrupter or blender circuit in an amplifier circuit interrupts the signal transmission without generating any audible transient. The circuit disclosed in this device includes a switch in a grid circuit permitting the grid potential to rise to a high negative potential when the switch is open. To avoid clipping of of the input signal as the tube is cut off, a light circuit combined with a photo emissive device shunts the signal to ground thereby attenuating the amplitude of the input signal to prevent clipping of the signal during the signal transmission through the amplifier stage.

It is an object of this invention to apply a suitable bias on the control element of an amplifier simultaneously with attenuation of the signal through a photo interrupter circuit.

It is another object of this invention to shunt the input signal to ground by means of a photo interrupter circuit, as a cutoff bias is applied to the control element of an amplifier.

It is a further object of this invention to combine a photo interrupter circuit with a bias circuit to shunt the signal to ground and thereby prevent clipping during cutoff of the amplifier.

The objects of this invention are accomplished by placing a bias on the control element of an amplifier for normal operation of the tube by means of a plurality of resistors serially connected between a high negative potential and a neutral potential. A photo interrupter circuit is connected intermediate a signal source and the amplifier stage. The signal is transmitted through a coupling capacitor to the control element of the amplifier stage. A photo emissive device is connected across the signal source on the input side of the coupling capacitor. A light circuit including a switch, and a resistance are serially connected across a suitable voltage source.

As the photo emissive device is illuminated by the lamp, its resistance is drastically lowered and the amplitude of the signal on the control element of the amplifier is reduced. The negative bias on the control element is allowed to increase in such a manner that the signal transmission is completely cut-off after a predetermined time. Since the signal magnitude on the control grid is simultaneously reduced, clipping and distortion are held to a minimum. The time constant of the light circuit and the time constant of the bias circuit have predetermined values to provide optimum operating conditions.

The following figure illustrates the preferred version of the signal control circuit. Various modifications of this circuit might be devised which fall within the spirit of the invention of which the preferred version is illustrated in the following figure.

The drawing illustrates a signal control circuit intermediate of the signal source and the amplifier stage.

Referring to the drawing the signal source may be a conventional oscillator 1 connected intermediate the terminals 2 and the neutral potential 3. The signal is developed across the weighting resistor 4 which is representative of a plurality of resistors with suitable switching means not shown. The signal is transmitted through the coupling capacitor 5 which in turn is connected to the control grid 6 of the amplifier stage 7. The plate of the amplifier stage is connected to the B+ through a suitable circuit.

The bias for the tube on the grid 6 is supplied by the negative potential of approximately −60 volts connected to the terminal 8. The resistor 9 is connected in series with the resistor 10 to provide a bias potential on the terminal 11. The resistor 9 is connected through the switch 12 to a neutral potential. Capacitor 31 is connected across the switch 12. The grid resistor 13 is connected intermediate the terminal 11 and the control grid 6. The cathode 40 is connected to ground through resistor 25 and capacitor 41. During normal amplifier operation the switch 12 is closed.

The switch 12 is ganged with switch 14 in the light circuit. Capacitor 30 is connected across switch 14. The light circuit is connected to the suitable voltage source through terminal 15. The lamp 16 and resistor 17 are connected to the switch 14 in series across a suitable voltage source and the neutral potential. The lighting circuit controls the conductivity of the photo emissive device 18. The photo emissive device is connected in parallel with the resistor 4 to the input of the coupling capacitor and a neutral potential.

The device operates in the following manner. During normal operation of the tube the cathode is connected through a resistive element 25 to ground. The plate 26 is connected through a suitable circuit to B+ potential.

The control grid 6 has a fixed bias controlled by the negative potential of approximaetly −60 volts impressed across resistors 10 and 9 in series through switch 12 to neutral potential. This places a voltage of approximately −6 volts on the grid 6. The signal voltage is developed on the grid resistor 13 through normal operation of the grid tube. The switch 14 is normally in an open position and the lamp 16 is dark.

To interrupt the signal the switch 14 is closed and the switch 12 is opened. Upon opening of the switch 12 the capacitor 29 charges in an exponential manner cutting off the tube 7 as the potential on the grid 6 goes below the cutoff potential for the tube. The signal from the signal source decreases in response to the illumination of the lamp 16. The timing of the illumination of the lamp 16 is controlled by the resistor 17 connected through the switch 14 to a neutral potential. With the switch 14 closed the lamp is turned on and the resistance of the photo emissive device decreases. With a decrease in resistance of the photo emissive device 18 the signal is shunted to ground which decreases the signal amplitude on the grid by the virtue of the action of voltage divider consisting of resistor 30 and photo emissive device 18, and any audible clipping of the signal as the tube is driven into cut-off is eliminated. A switching transient is substantially reduced by the capacitors 29 and 31 as the switch 12 is opened. In this manner extraneous noises are prevented from passing through the amplifier stage 7.

The photo interrupter circuit as described is a preferred embodiment of this invention and is claimed in the following attached claims.

What is claimed is:

1. A photo interrupter circuit for use with an amplifier stage comprising, a signal source, an amplifier stage, a signal transmitting network connected between said signal source and amplifier stage, a signal shunting means including a photo emissive device connected intermediate said signal transmitting network and a neutral potential, a radiation element having energizing means associated with said photo emissive device, a bias circuit connected to the control element of said amplifier stage including a source of high negative potential, switching means including a first switch selectively and alternatively connecting said bias circuit to a neutral potential and a second switch connecting said radiation element to a neutral potential thereby activating said photo emissive device to simultaneously shunt the signal in said signal transmitting network to a neutral potential while applying a rise in the negative potential on the control element of said amplifier stage as the signal transmission is interrupted.

2. A signal control circuit comprising a signal source, an amplifier stage, a signal transmitting network connected to said signal source and a control element of said amplifier stage, a shunting circuit including a photo emissive device connecting said network and to ground, a radiation element directing radiation on said photo emissive device connected to a suitable voltage, a resistance and capacitance connected to said radiation element eliminating switching transients and controlling the radiation time, a bias network including a voltage divider connected to a suitable negative potential applying a negative potential to the control element of said amplifier stage, switching means connected to said radiation element through said resistance and capacitance controlling the radiation of said radiation element and changing the resistance of said photo emissive device for shunting the signal, from said network to ground while simultaneously disconnecting said voltage divider from ground causing said control element of said amplifier stage to rise to a high negative potential to thereby cut off said amplifier stage.

3. An interrupter circuit comprising in combination, a signal source generating a signal, an amplifier stage for amplifying a signal, a signal transmitting network connected between said signal source and said amplifier stage for applying a signal from said source to a control element of said amplifier stage, an attenuator connected to said signal transmitting network including a photoemissive device attenuating the signal when said photoemissive device is conducting, a bias circuit applying a bias potential to the control element of said amplifier stage including a voltage divider connected to a negative voltage of sufficient magnitude to cut off the amplifier stage, light means having energizing means directing light on said photoemissive device, switching means connected to said light means and said bias circuit selectively and alternatively controlling the energization of said light means and the opening of said biasing circuit for attenuating the signal in said signal transmitting network and applying a cut-off bias on the control element of said amplifier stage, or controlling the closing of said bias circuit to apply normal operating bias potential on said control element and deenergizing said lighting means thereby permitting normal signal transmission in said signal transmitting network.

References Cited in the file of this patent

FOREIGN PATENTS 585,419 Great Britain ------------ Feb. 6, 1947